(12) United States Patent
Chang et al.

(10) Patent No.: US 7,467,365 B2
(45) Date of Patent: Dec. 16, 2008

(54) SANITY CHECKER FOR INTEGRATED CIRCUITS

(75) Inventors: George H. Chang, Taipei (TW); Yi-Kan Cheng, Taipei (TW); Chen-Teng Fan, Beipu Township, Hsinchu County (TW); Chen-Lin Yang, Hsinchu (TW); Yung-Chin Hou, Taipei (TW); Chu-Ping James Wang, Hsinchu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 141 days.

(21) Appl. No.: 11/521,095

(22) Filed: Sep. 14, 2006

(65) Prior Publication Data
US 2008/0072191 A1 Mar. 20, 2008

(51) Int. Cl.
*G06F 17/50* (2006.01)

(52) U.S. Cl. ............................................. 716/5; 703/16

(58) Field of Classification Search ..................... 716/5; 703/16
See application file for complete search history.

(56) References Cited

U.S. PATENT DOCUMENTS

| | | | |
|---|---|---|---|
| 5,956,497 A * | 9/1999 | Ratzel et al. | 716/1 |
| 6,473,881 B1 * | 10/2002 | Lehner et al. | 716/2 |
| 6,577,992 B1 * | 6/2003 | Tcherniaev et al. | 703/14 |
| 2001/0013791 A1 * | 8/2001 | Van Lammeren et al. | 324/765 |
| 2003/0115035 A1 * | 6/2003 | Kulshreshtha et al. | 703/19 |
| 2004/0168143 A1 * | 8/2004 | Kishibe | 716/10 |
| 2006/0112356 A1 * | 5/2006 | McGaughy et al. | 716/3 |
| 2007/0006109 A1 * | 1/2007 | Bartling et al. | 716/11 |
| 2007/0150843 A1 * | 6/2007 | Su et al. | 716/3 |
| 2007/0192752 A1 * | 8/2007 | Bhattacharya et al. | 716/4 |

* cited by examiner

*Primary Examiner*—Phallaka Kik
(74) *Attorney, Agent, or Firm*—K & L Gates LLP

(57) ABSTRACT

This invention discloses a method for sanity checking integrated circuit (IC) designs based on one or more predefined sub-circuits with at least one predefined checking criteria, the method comprising automatically reading one or more netlists, identifying one or more sub-circuits in the netlists isomorphic to at least one of predefined sub-circuits, identifying one or more device parameters for sanity checking the identified sub-circuits, and comparing the identified device parameters against the predefined checking criteria.

15 Claims, 5 Drawing Sheets

SANITY CHECKER FOR INTEGRATED CIRCUITS

BACKGROUND

The present invention relates generally to integrated circuit (IC) designs, and, more particularly, to layout-based circuit sanity checks.

As the feature size of integrated circuits (ICs or simply circuits) continues to shrink, more and more ICs with more complex designs, such as system-on-chip (SoC), can be packed into a given semiconductor die size. IC designs are increasingly relying upon computer-aided-design (CAD) tools for circuit designs, mask layouts, as well as sanity checks at all steps of the design process.

In fabrication of ICs, each processing step involving photolithography often uses a "mask", which comprises a set of geometric patterns typically representing an addition or deletion of materials such as metal, polysilicon, or substrate in a finished IC. Through the photolithography, the patterns are made to the semiconductor substrate, which eventually become the IC.

If a mistake is made in a design, debugging the finished chip is very difficult and time consuming. Once "bugs" are found, a new revision of the IC design is generated, and there are certain inevitable revisions that have to be made to the masks as well. The cost for changing the mask nowadays is very expensive. Accordingly, circuit designers currently employ design checking tools to ensure the design is relatively "clean" with correct functionality and robustness for anticipated process variations.

A traditional gate level IC design flow follows. Firstly, designers create a set of schematic diagrams (or schematics for short) based on product requirements. Secondly, a SPICE (Simulation Program with Integrated Circuits Emphasis) netlist is generated from the schematic diagrams for running various simulations, such as timing and power, etc., on the design. A "netlist" is a file describing the connectivity of various instances and their attributes in a circuit design. Then, a layout is generated based on the set of schematic diagrams. The layout is a graphic drawing based on which mask layers can be produced. In design, a digitized representation of an image of a mask is commonly called a "mask layer" or simply a "layer". Due to the complexity of the designs, CAD tools are used by engineers to produce a correct layout. In general, these CAD tools are called DRC/ERC (design rule check/ electrical rule check) and LVS (layout vs. schematic). DRC/ ERC checks layout's conformance and correctness to the requirements of a given process and LVS checks the layouts' conformance to the schematics.

However, the traditional gate level IC design flow has certain limitations such as SPICE models for simulation and mainly covers inter-die variations, and not intra-die variations. Intra-die variations cause difficulty in predicting circuit functionality of those dynamic circuits sensitive to any leakage with SPICE models. Sub-threshold leakage along with intra-die variations, which have become a serious problem as device channel length, threshold voltage and power supply voltage are scaling down. For a large SoC design, block interface circuitries are also not easy to check by SPICE simulation.

Accordingly, in a traditional gate level IC design flow, a fundamental assumption is that the schematic diagrams created by the designers are both functionally and electrically correct, and all the steps subsequent to the schematics are checked against the schematics for correctness. However, if the schematics have a logic error or tend to create excessive sub-threshold leakage, then all the DRC/ERC and LVS just cannot do anything about the error or the leakage. Unfortunately, the schematics are created by human beings, and in a large SoC design with millions of transistors, errors and oversights are almost inevitable.

Another issue is known as design marginality. Certain circuits, such as dynamic circuits and feedback-type circuits are more sensitive to process variations. Accordingly, robust designs for such circuits are even more critical.

Other high level designs, such as RTL (register transfer logic), employs logic synthesis and requires a person to create the circuit description. The building blocks of the high level design are still gate level circuits, and block interfaces are even more of a concern.

Accordingly, there is a need for an improved design sanity checker to help designers screen out problematic circuits due to human errors or oversights in an IC design.

SUMMARY

The present invention discloses a method for sanity checking integrated circuit (IC) designs based on one or more predefined sub-circuits with at least one predefined checking criteria. The method comprises steps such as automatically reading one or more netlists, identifying one or more sub-circuits in the netlists isomorphic to at least one of the predefined sub-circuits, identifying one or more device parameters for sanity checking the identified sub-circuits, and comparing the identified device parameters against the predefined checking criteria.

The construction and method of operation of the invention, however, together with additional objectives and advantages thereof will be best understood from the following description of specific embodiments when read in connection with the accompanying drawings.

DESCRIPTION

The present disclosure provides a design sanity checker to help designers screen out problematic circuits due to human errors or oversights in an IC design.

Figure 1:
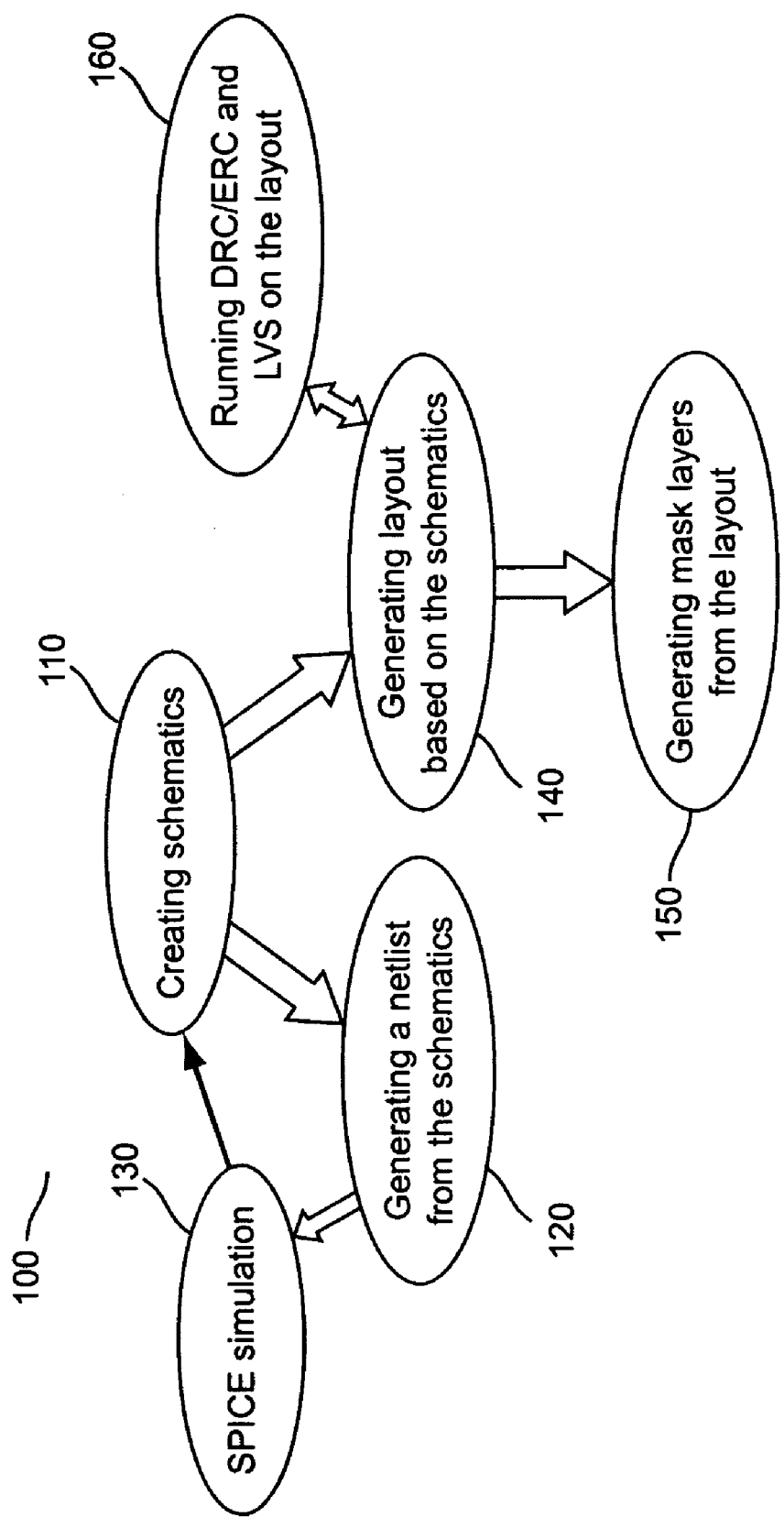
FIG. 1 is a block diagram illustrating a conventional circuit design work flow.

FIG. 1 is a block diagram illustrating a conventional circuit design work flow 100. Designers first create a set of schematic diagrams in step 110. A netlist is then generated from the schematics by a schematic capturing tool in step 120. The netlist is then used to conduct various kinds of SPICE simulations for checking function, timing and power, etc. of the circuit under design. The SPICE simulation result is fed back to the schematics to correct any mistake or further improve the circuit design. Finalized schematics are then used for generating a layout in step 140. The layout is a graphical representation of an actual circuit and is used to generate a set of mask layers for producing physical chips in step 150. To ensure that the layout meets all the design rules and electrical rules, a design rule checker/electrical rule checker (DRC/ERC) tool is run for the layout in step 160, and any rule violation will be flagged. The layout also has to conform to the schematics. A layout vs. schematic (LVS) tool is used for that purpose, also shown in step 160 of FIG. 1.

One of the shortcomings of the conventional circuit design work flow, as shown in FIG. 1, is the lack of checking mechanism for the schematics themselves. The correctness of the schematics depends on the designers' knowledge and diligence, which is not always a sure thing.

Figure 2:
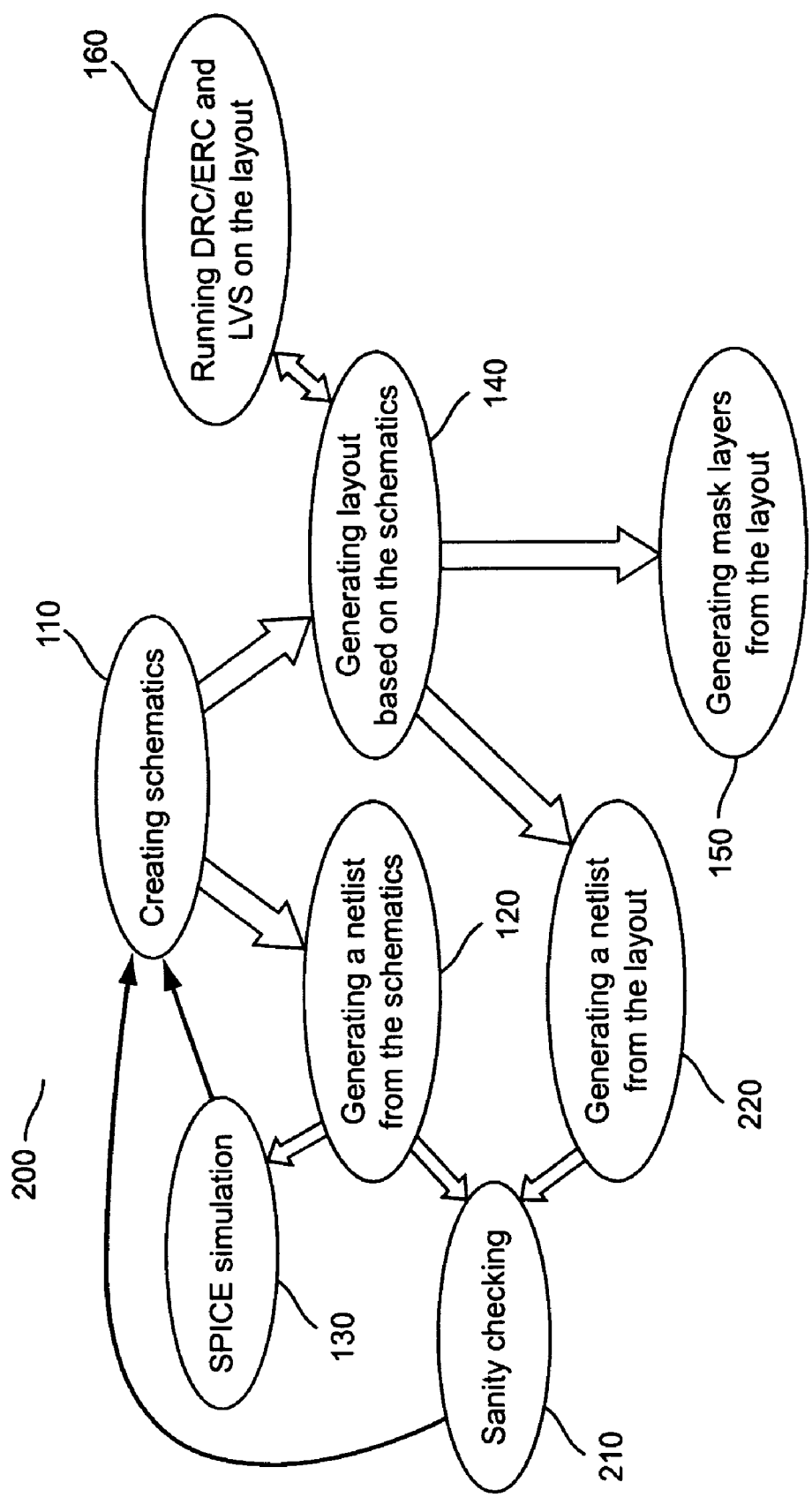
FIG. 2 is a block diagram illustrating a circuit design work flow incorporating a design sanity checker according to one embodiment of the present invention.

FIG. 2 is a block diagram illustrating a circuit design work flow 200 incorporating a design sanity checker according to one embodiment of the present invention. The netlist generated from schematics is not only used to run SPICE simulation, but also to run design sanity checker in step 210. Results from the design sanity checker 210 are then used to improve the schematics of step 110.

Referring to FIG. 2, design sanity checker 210 may also be implemented in another stage of the design flow. That is, after generating a netlist from the layout in step 220, the design sanity checker 210 is run on the layout-generated netlist. It is understood that based on the requirements of various designs, the sanity checking can be done in either stages or both. One of the advantages of running design sanity checks is to screen out any user that caused design errors or oversights that can possibly occur during the design process; such design errors or oversights are almost inevitable in a large IC design.

Figure 3A:
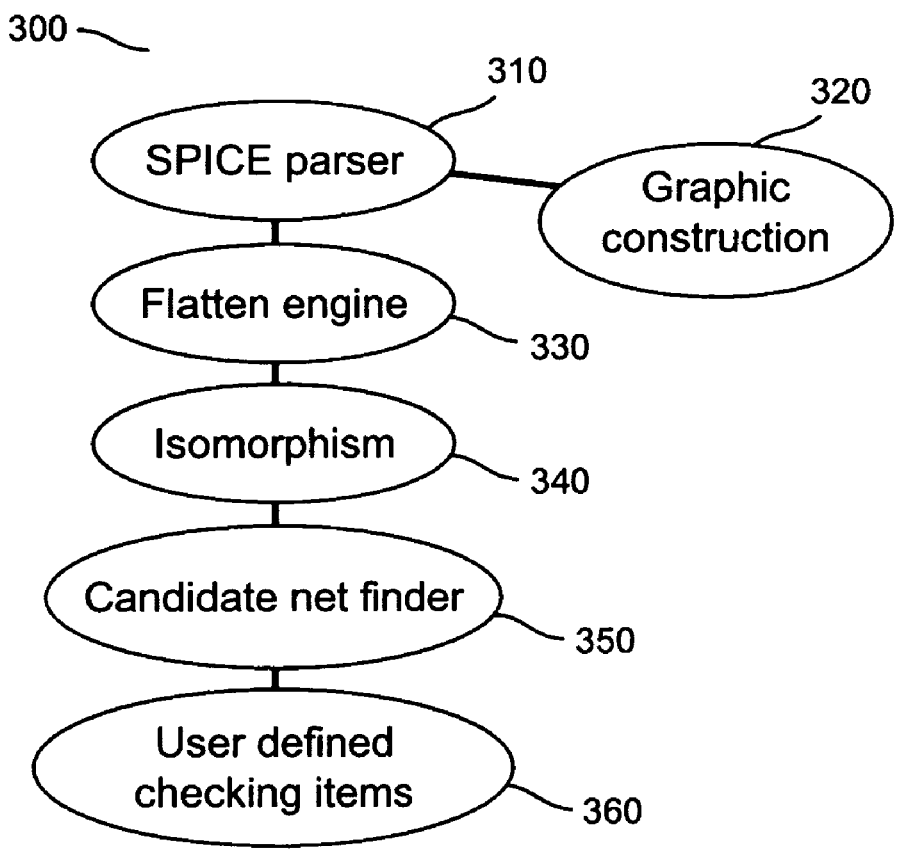
FIGS. 3A and 3B are block diagrams illustrating modules of a design sanity checker according to one embodiment of the present invention.

FIG. 3A is a block diagram illustrating modules of a design sanity checker 300 according to one embodiment of the present invention. The design sanity checker 300 can be a software program for performing the sanity checking as in step 210 of FIG. 2. A SPICE parser module 310 reads a SPICE netlist of various data structure and then organizes devices and their connections defined in the netlist into the design sanity checker's own data structure. A graphic construction module 320 associated with the SPICE parser module 310 generates a circuit representation into a schematic or layout format so that the design sanity checker results can be easily read, and error messages flagged. As schematics are normally drawn in hierarchical style, and so is the netlist generated thereof. However, in some cases, a flat netlist is more desirable for inspecting the circuit. In such a case, a flatten engine module 330 may be provided to transform the hierarchical netlist into a flat netlist. But in other cases, emphasis is placed on the interfaces between the cells within a large circuit, and then the hierarchical netlist may be preserved. An isomorphism engine 340 is provided to filter out predefined functional cells or sub-circuits, such as NAND and latches, etc. Here, the sub-circuits are referred to those circuits containing multiple transistors. A candidate net finder 350 is to group nets into different connection types, such as P-type metal-semiconductor-oxide (PMOS) transistor source/drain connection, PMOS gate connection, N-type metal-semiconductor-oxide (NMOS) source/drain connection or NMOS gate connection, etc. Within a type of connection, the nets can be further grouped into sub-groups according to the number of devices connected to a net. Primary input/output nets may be distinguished out as well. When the netlist is isomorphically organized according to functional sub-circuits, and all the nets are grouped, then user defined checking items 360 may be correctly carried out.

Figure 3B:
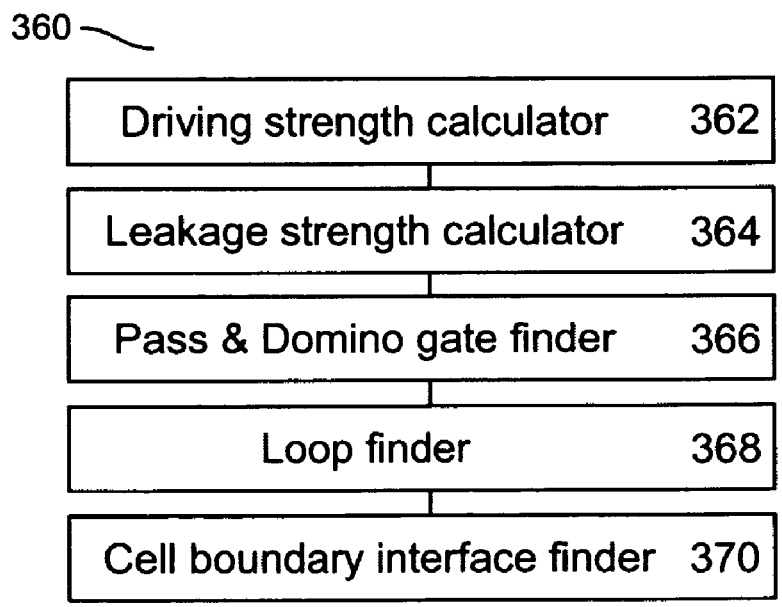

FIG. 3B shows exemplary sub-modules of the user defined checking items module 360 according to one embodiment of the present invention. Driving strength calculator sub-module 362 calculates the driver size vs. driver loading. If a driver size is too small for a loading, signal transitions will take too long, both timing and active power consumption may cause problems. Leakage strength calculator sub-module 364 calculates a worst case leakage path. If the value of the worst case leakage path exceeds a user defined value, the design sanity checker 300 will report an error for that leakage path. A Pass and dynamic gate finder sub-module 366 picks out pass gates and dynamic gates, which are very sensitive to leakage. The device sizes in these sub-circuits are also defined by the user. Any violation of the user defined device sizes will be picked out by the design sanity checker 300. A loop finder 368 may be provided to find feedback circuits and to check if there is any data contention problem. A cell boundary interface finder 370 is for checking specifically at cell boundary interfaces. The cell boundary interfaces have their own sets of rules, which are also defined by the user.

Figure 4A:
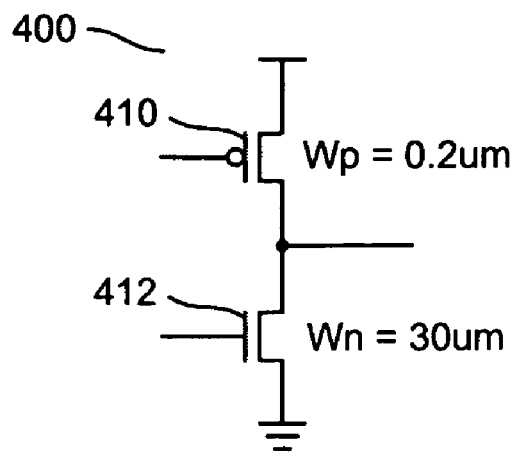
FIGS. 4A~4D are schematic diagrams showing examples of problematic circuits that the sanity checker is intended to screen out.

FIG. 4A shows an exemplary sub-circuit 400 of a PMOS transistor 410 and a NMOS 412. If the channel width of the PMOS transistor 410 is Wp=0.2 um, while a channel width of the NMOS transistor 412 is Wn=30 um, then the PMOS transistor 410 is too weak to pull up the strong pull down NMOS transistor 412, and will have problems during signal transition. If P/N ratio is already defined by the user in the driving strength calculator module 362, the design sanity check can screen out this problematic sub-circuit 400.

Figure 4B:
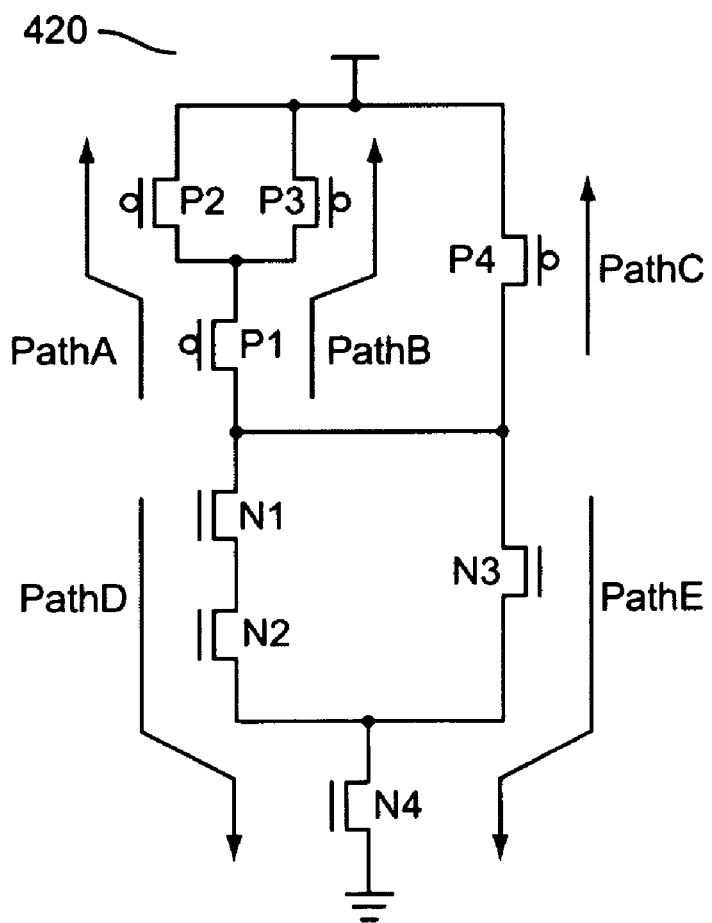

FIG. 4B is an exemplary sub-circuit 420 for demonstrating how to calculate minimum driving strength and maximum leakage strength. A driving strength of PathA can be represented by $$D\_PathA = \frac{1}{\frac{L\_P1}{W\_P1} + \frac{L\_P2}{W\_P2}},$$

where L and W stands for a channel length and a channel width of a transistor, respectively. So, L_P1 stands for the channel length of the PMOS transistor P1, and W_P1 stands for the channel width of the PMOS transistor P1, and so on and so forth. Then the minimum driving strength of the PMOS side of the sub-circuit 420 can be obtained from MIN (PathA, PathB, PathC). The minimum driving strength of the NMOS side of the sub-circuit 420 can be obtained from MIN(PathD, PathE).

Referring to FIG. 4B again, a leakage strength of the PMOS transistors P2 and P3 can be expressed as $$\frac{W\_P2}{L\_P2} + \frac{W\_P3}{L\_P3}.$$

The maximum leakage strength of NMOS transistors N1 and N2 can be expressed as $$MAX\left(\frac{W\_N1}{L\_N1} + \frac{W\_N2}{L\_N2}\right).$$

A leakage strength of the PMOS side of the sub-circuit 420 can be expressed as MAX(((P2+P3), P1)+P4). Similarly, a leakage strength of the NMOS side of the sub-circuit 420 can be expressed as MAX((MAX(N1, N2)+N3), N4).

The user may provide a value for either the minimum driving strength or the maximum leakage strength. If any sub-circuit has a driving strength or a leakage strength that exceeds the provided value, then the design sanity checker 300 will flag an error message for the violation of the provided value.

Figure 4C:
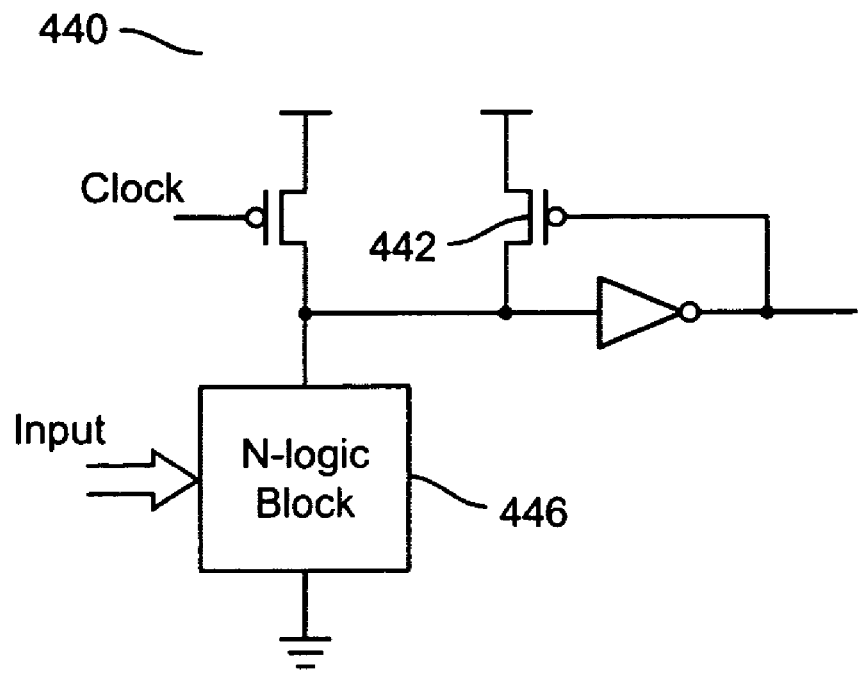

FIG. 4C is a schematic of a dynamic gate 440. Design sanity check for the dynamic gate 440 includes comparing ratios of the largest NMOS transistor in the N-logic block 446 to the smallest PMOS 442.

Figure 4D:
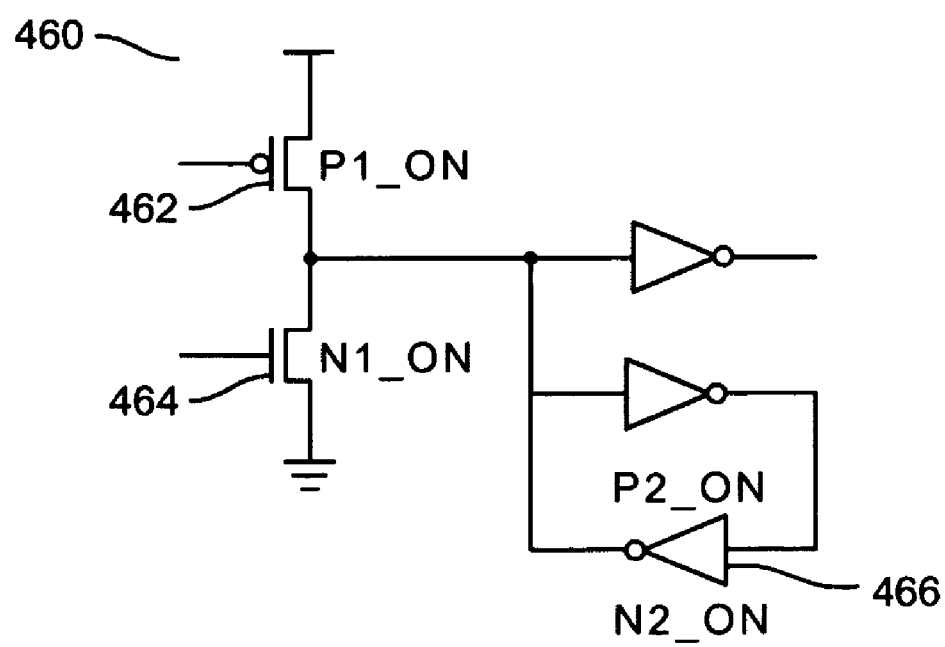

FIG. 4D is a schematic of a circuit 460 containing a feedback inverter 466. Data contention can be a problem if the devices contained therein are not sized correctly. The loop finder sub-module 368 shown in FIG. 3B is intend to screen out this kind of feedback circuit. Referring to FIG. 4D, design sanity checking can be done on the following ratios:

$$\frac{W\_P1}{W\_N2}$$

for pull-up strength, and $$\frac{W\_N1}{W\_P2}$$

for pull-down strength.

Again, the user can provide a value for these ratios, the design sanity checker search for any violation in the entire circuit, and flag an error message if it found any violation.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for sanity checking integrated circuit (IC) designs based on one or more predefined sub-circuits with at least one predefined checking criteria, the method comprising:
    automatically reading one or more netlists generated from one or more layouts;
    identifying one or more sub-circuits in the netlists isomorphic to at least one of the predefined sub-circuits;
    identifying one or more device parameters for sanity checking the identified sub-circuits;
    performing one or more predetermined calculations on the identified device parameters, wherein one of the predetermined calculations includes a leakage strength calculation to identify a worst case leakage path;
    comparing one or more results from the predetermined calculations against the predefined checking criteria.

2. The method of claim 1, wherein the netlists are generated from one or more schematics with hierarchical cell structure.

3. The method of claim 2, wherein identifying one or more sub-circuits further comprises identifying one or more cell boundary interfaces from the netlists.

4. The method of claim 1, wherein automatically reading further comprises parsing the netlists of one or more different data formats into a predetermined data format.

5. The method of claim 1, wherein the automatically reading further comprises flattening the netlists into a flat data structure.

6. The method of claim 1, wherein the identifying one or more sub-circuits further comprises finding one or more candidate nets fit one or more predefined parameters of a net.

7. The method of claim 1, wherein one of the predetermined calculations further includes driving strength calculation.

8. The method of claim 7, wherein the driving strength calculation further comprises finding one or more pass gates or one or more dynamic gate, and calculating the driving strength of the pass gates or the dynamic gates.

9. The method of claim 7, wherein the driving strength calculation further comprises finding one or more feedback loop and checking for one or more data contentions in the feedback loop.

10. A method for sanity checking integrated circuit (IC) designs based on one or more predefined sub-circuits with at least one predefined checking criteria, the method comprising:
    automatically reading one or more netlists generated from one or more layouts;
    parsing the netlists of one or more different data formats into a predetermined data format;
    identifying one or more sub-circuits in the netlists isomorphic to at least one of the predefined sub-circuits;
    identifying one or more device parameters for sanity checking the identified sub-circuits;
    performing one or more predetermined calculations on the identified device parameters, wherein one of the predetermined calculations includes a leakage strength calculation to identify a worst case leakage path; and
    comparing one or more results from the predetermined calculations against the predefined checking criteria.

11. The method of claim 10, wherein one of the predetermined calculations is a driving strength calculation.

12. The method of claim 11, wherein the driving strength calculation further comprises finding one or more pass gates or one or more dynamic gate, and calculating the driving strength of the pass gates or the dynamic gates.

13. The method of claim 11, wherein the driving strength calculation further comprises finding one or more feedback loop and checking for one or more data contentions in the feedback loop.

14. A method for sanity checking integrated circuit (IC) designs based on one or more predefined sub-circuits with at least one predefined checking criteria, the method comprising:
    reading one or more netlists generated from one or more layouts;
    identifying one or more sub-circuits in the netlists isomorphic to at least one of the predefined sub-circuits;
    identifying one or more device parameters for sanity checking the identified sub-circuits;
    performing one or more predetermined calculations on the identified device parameters, wherein one of the predetermined calculations includes a leakage strength calculation to identify a worst case leakage path; and
    comparing one or more results from the predetermined calculations against the predefined checking criteria.

15. The method of claim 14, wherein one of the predetermined calculations is a driving strength calculation.

* * * * *